(12) United States Patent
Morimoto

(10) Patent No.: US 10,284,193 B2
(45) Date of Patent: May 7, 2019

(54) SEMICONDUCTOR SWITCH CONTROL DEVICE

(71) Applicant: Yazaki Corporation, Tokyo (JP)

(72) Inventor: Mitsuaki Morimoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 43 days.

(21) Appl. No.: 15/725,839

(22) Filed: Oct. 5, 2017

(65) Prior Publication Data

US 2018/0123584 A1  May 3, 2018

(30) Foreign Application Priority Data

Oct. 28, 2016 (JP) ................................. 2016-212143

(51) Int. Cl.
| | |
|---|---|
| *H03K 3/00* | (2006.01) |
| *H03K 17/26* | (2006.01) |
| *B60L 3/00* | (2019.01) |
| *B60L 3/04* | (2006.01) |
| *H03K 17/18* | (2006.01) |

(52) U.S. Cl.
CPC ............ *H03K 17/26* (2013.01); *B60L 3/0084* (2013.01); *B60L 3/04* (2013.01); *H03K 17/18* (2013.01)

(58) Field of Classification Search
None
See application file for complete search history.

(56) References Cited

U.S. PATENT DOCUMENTS

| | | | | |
|---|---|---|---|---|
| 8,612,073 B2* | 12/2013 | Fuji | ............................ | B60L 3/00 |
| | | | | 307/10.1 |
| 9,178,352 B2* | 11/2015 | Butler | ........................ | H02H 9/04 |
| 9,312,797 B2* | 4/2016 | Hayashi | .................. | H02P 27/06 |
| 9,327,658 B2* | 5/2016 | Watanabe | ............... | B60R 16/02 |
| 9,590,428 B2* | 3/2017 | Kashiwagi | .............. | H02J 50/12 |
| 2006/0044045 A1* | 3/2006 | Sakata | ..................... | H02M 1/32 |
| | | | | 327/434 |
| 2010/0110801 A1* | 5/2010 | Song | ....................... | G11C 5/143 |
| | | | | 365/189.05 |
| 2010/0164278 A1* | 7/2010 | Oyobe | ...................... | B60K 6/26 |
| | | | | 307/9.1 |

(Continued)

FOREIGN PATENT DOCUMENTS

JP 2007-285969 A 11/2007

*Primary Examiner* — Lincoln D Donovan
*Assistant Examiner* — Khareem E Almo
(74) *Attorney, Agent, or Firm* — Kenealy Vaidya LLP

(57) ABSTRACT

A semiconductor switch control device includes a bidirectional shutoff circuit that transmits or shuts off a current flowing bidirectionally between a high-voltage battery and a high-voltage load, a resistor that detects a voltage of the bidirectional shutoff circuit, a first voltage detector that detects a voltage applied to the resistor, and a controller configured to determine malfunction of the bidirectional shutoff circuit, based on a first detected voltage detected by the first voltage detector. The bidirectional shutoff circuit includes a first FET and a second FET including respective source terminals connected in series, and a third FET and a fourth FET including respective source terminals connected in series. The resistor includes one end connected between the source terminals of the first FET and the second FET, and the other end connected between the source terminals of the third FET and the fourth FET.

14 Claims, 11 Drawing Sheets

(56) References Cited

U.S. PATENT DOCUMENTS

| | | | |
|---|---|---|---|
| 2011/0309874 A1* | 12/2011 | Takimoto | H03K 17/0814 327/427 |
| 2013/0127518 A1* | 5/2013 | Nakao | H02M 1/36 327/434 |
| 2014/0218074 A1* | 8/2014 | Murata | H03K 17/14 327/109 |
| 2014/0312810 A1* | 10/2014 | Toda | B60L 11/1801 318/139 |
| 2016/0359483 A1* | 12/2016 | Mukhopadhyay | H03K 17/74 |
| 2017/0170821 A1* | 6/2017 | Marini | H02M 1/32 |
| 2017/0302151 A1* | 10/2017 | Snook | H02M 1/08 |
| 2018/0034388 A1* | 2/2018 | Kawai | H02H 9/002 |
| 2018/0088614 A1* | 3/2018 | Choi | H03K 17/162 |
| 2018/0153021 A1* | 5/2018 | Gotou | H05B 37/0209 |
| 2018/0309360 A1* | 10/2018 | Nam | H02M 1/08 |

* cited by examiner

SEMICONDUCTOR SWITCH CONTROL DEVICE

CROSS-REFERENCE TO RELATED APPLICATION(S)

The present application claims priority to and incorporates by reference the entire contents of Japanese Patent Application No. 2016-212143 filed in Japan on Oct. 28, 2016.

BACKGROUND OF THE INVENTION

1. Field of the Invention

The present invention relates to a semiconductor switch control device.

2. Description of the Related Art

Conventionally, electric cars and/or hybrid electric cars are equipped with a high-voltage load such as a drive motor, and a high-voltage battery to drive the high-voltage load, and provided with a switch to transmit or shut off a current flowing from the high-voltage battery to the high-voltage load, for the purpose of security. A mechanical relay is mainly used as the switch. In recent years, a semiconductor switch is increasingly used as the switch. Japanese Patent Application Laid-open No. 2007-285969 discloses a malfunction detection circuit detecting malfunction of a semiconductor switch to improve reliability of a system.

The malfunction detection circuit tends to increase in size with an increase in constituent elements of the circuit.

SUMMARY OF THE INVENTION

The present invention has been made in consideration of the above, and an object of the present invention is to provide a semiconductor switch control device capable of suppressing an increase in size in determination of malfunction of a semiconductor switch.

In order to achieve the above mentioned object, a semiconductor switch control device according to one aspect of the present invention includes a semiconductor switch module installed between a power supply and a load, and that transmits or shuts off a current flowing bidirectionally between the power supply and the load, a resistor that detects a voltage of the semiconductor switch module, a first voltage detector that detects a voltage applied to the resistor, and a controller configured to determine malfunction of the semiconductor switch module, based on a first detected voltage detected by the first voltage detector, wherein the semiconductor switch module includes a first semiconductor switch module, and a second semiconductor switch module connected in parallel with the first semiconductor switch module, the first semiconductor switch module includes a first forward switch including a body diode disposed in a forward direction serving as a direction in which the current flows, and a first reverse switch disposed adjacent to the first forward switch, and including a body diode disposed in a reverse direction reverse to the forward direction, the first forward switch and the first reverse switch include respective source terminals connected in series, and respective drain terminals, one of the drain terminals being connected with the power supply, and the other of the drain terminals being connected with the load, the second semiconductor switch module includes a second forward switch including a body diode disposed in the forward direction and a second reverse switch disposed adjacent to the second forward switch, and including a body diode disposed in the reverse direction, the second forward switch and the second reverse switch include respective source terminals connected in series, and respective drain terminals, one of the drain terminals being connected with the power supply, and the other of the drain terminals being connected with the load, and the resistor includes one end connected between the source terminals of the first forward switch and the first reverse switch, and the other end connected between the source terminals of the second forward switch and the second reverse switch.

A semiconductor switch control device according to another aspect of the present invention includes a semiconductor switch module installed between a power supply and a load, and that transmits or shuts off a current flowing bidirectionally between the power supply and the load, a resistor that detects a voltage of the semiconductor switch module, a first voltage detector that detects a voltage applied to the resistor, and a controller configured to determine malfunction of the semiconductor switch module, based on a first detected voltage detected by the first voltage detector, wherein the semiconductor switch module includes a first semiconductor switch module, and a second semiconductor switch module connected in parallel with the first semiconductor switch module, the first semiconductor switch module includes a first forward switch including a body diode disposed in a forward direction serving as a direction in which the current flows, and a first reverse switch disposed adjacent to the first forward switch, and including a body diode disposed in a reverse direction reverse to the forward direction, the first forward switch and the first reverse switch include respective drain terminals connected in series, and respective source terminals, one of the source terminals being connected with the power supply, and the other of the source terminals being connected with the load, the second semiconductor switch module includes a second forward switch including a body diode disposed in the forward direction, and a second reverse switch disposed adjacent to the second forward switch, and including a body diode disposed in the reverse direction, the second forward switch and the second reverse switch include respective drain terminals connected in series, and respective source terminals, one of the source terminals being connected with the power supply, and the other of the source terminals being connected with the load, and the resistor includes one end connected between the drain terminals of the first forward switch and the first reverse switch, and the other end connected between the drain terminals of the second forward switch and the second reverse switch.

According to still another aspect of the present invention, in the semiconductor switch control device, the controller may determine that any of the first forward switch, the first reverse switch, the second forward switch, and the second reverse switch incurs an OFF-state malfunction in which the determined switch is in an OFF state, based on a shift amount between the first detected voltage and a predetermined first reference voltage, when an instruction is issued to turn on all of the first forward switch, the first reverse switch, the second forward switch, and the second reverse switch.

According to still another aspect of the present invention, in the semiconductor switch control device, the controller may determine that one of the first forward switch and the second reverse switch incurs the OFF-state malfunction, when the shift amount between the first detected voltage and the first reference voltage is a positive voltage, and the controller may determine that one of the first reverse switch and the second forward switch incurs the OFF-state malfunction, when the shift amount between the first detected voltage and the first reference voltage is a negative voltage.

According to still another aspect of the present invention, the semiconductor switch control device may further includes a second voltage detector that detects a voltage applied to the load, wherein the controller determines malfunction of the semiconductor switch module, based on a second detected voltage detected by the second voltage detector.

According to still another aspect of the present invention, in the semiconductor switch control device, the controller may specify which of the first forward switch, the first reverse switch, the second forward switch, and the second reverse switch incurs an OFF-state malfunction, based on the second detected voltage detected by the second voltage detector, and instruction values to turn on/off the first forward switch, the first reverse switch, the second forward switch, and the second reverse switch, in the OFF-state malfunction of the semiconductor switch module.

In the semiconductor switch control device, the controller preferably determines that at least one of the first reverse switch and the second reverse switch incurs an ON-state malfunction in which the switch is in the ON state, when the second detected voltage exceeds a reference voltage, in the case where an instruction is issued to turn off all of the first forward switch, the first reverse switch, the second forward switch, and the second reverse switch.

In the semiconductor switch control device, the controller preferably determines that at least one of the first forward switch and the second forward switch incurs the ON-state malfunction, when the second detected voltage is equal to a voltage of the power supply, in the case where an instruction is issued to turn on all of the first reverse switch and the second reverse switch and an instruction is issued to turn off all of the first forward switch and the second forward switch.

In the semiconductor switch control device, the controller preferably determines which of the first forward switch, the first reverse switch, the second forward switch, and the second reverse switch incurs the ON-state malfunction, based on the first detected voltage detected by the first voltage detector, and instruction values to turn on/off the first forward switch, the first reverse switch, the second forward switch, and the second reverse switch, in the ON-state malfunction of the semiconductor switch module.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments according to the present invention will be explained hereinafter in detail with reference to drawings. The present invention is not limited to contents described in the following embodiments. Constituent elements described hereinafter include elements that could be easily thought of by the skilled person, and substantially equal elements. The structures described hereinafter may properly be combined. Various omissions, replacement, or change of the structure is possible within a range not departing from the gist of the present invention.

First Embodiment

Figure 1:
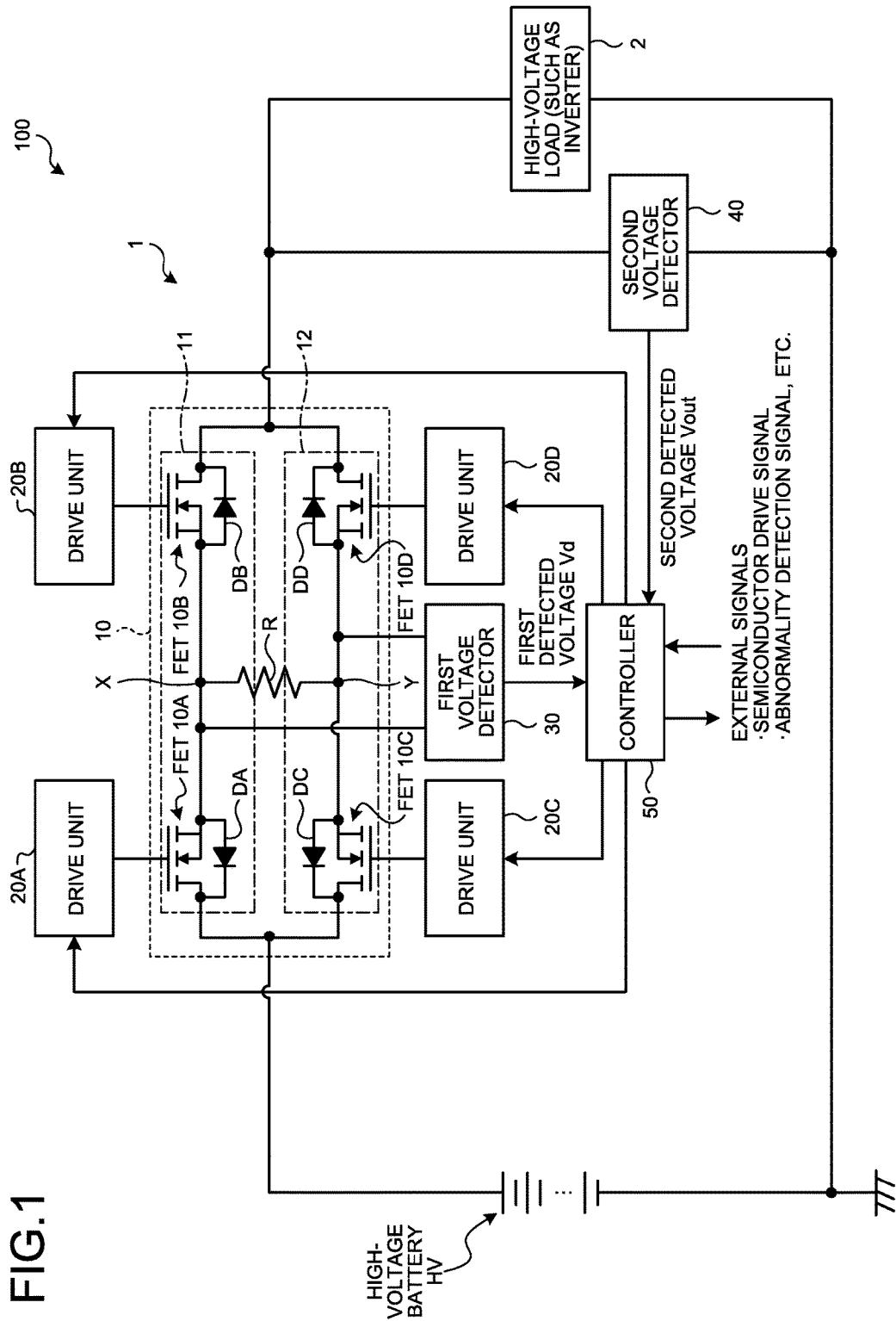
FIG. 1 is a block diagram illustrating a configuration example of a semiconductor switch control device according to a first embodiment.

A vehicle power system 100 for an electric car or a hybrid electric car or the like is equipped with a high-voltage load 2, such as an inverter, converting a direct current into an alternating current to supply electric power to a drive motor, and a high-voltage battery HV serving as a power supply to drive the high-voltage load 2, and provided with a semiconductor switch control device 1 to transmit or shut off a current flowing bidirectionally between the high-voltage battery HV and the high-voltage load 2 for the purpose of security, as illustrated in FIG. 1.

The semiconductor switch control device 1 includes a bidirectional shutoff circuit 10, drive units 20A to 20D, a resistor R, a first voltage detector 30, a second voltage detector 40, and a controller 50.

The bidirectional shutoff circuit 10 transmits or shuts off a current flowing bidirectionally between the high-voltage battery HV and the high-voltage load 2. The bidirectional shutoff circuit 10 is installed between a plus electrode of the high-voltage battery HV and the high-voltage load 2, to transmit or shut off a current flowing from the plus electrode of the high-voltage battery HV to the high-voltage load 2. The bidirectional shutoff circuit 10 also transmits or shuts off a current flowing from the high-voltage load 2 to the plus electrode of the high-voltage battery HV, in the case of a charging path to charge the high-voltage battery HV.

The bidirectional shutoff circuit 10 includes a first bidirectional shutoff circuit 11 serving as a first semiconductor switch module, and a second bidirectional shutoff circuit 12 serving as a second semiconductor switch module. The first bidirectional shutoff circuit 11 and the second bidirectional shutoff circuit 12 are connected in parallel. As described above, in the semiconductor switch control device 1, the bidirectional shutoff circuit 10 has a redundant configuration, and therefore it is possible to improve reliability. The first bidirectional shutoff circuit 11 includes a field effect transistor (FET) 10A, and a FET 10B. Here, the FET 10A is referred to as a first FET 10A and the FET 10B is referred to as a second FET 10B.

Each of the first and second FETs 10A, 10B is, for example, configured by an N-channel metal oxide semiconductor (MOS) FET. The first FET 10A functions as a first forward switch or a first reverse switch, in accordance with a direction in which the current flows. The first forward switch is a switch in which a body diode (parasitic diode) is disposed in a forward direction in which the current flows. The first reverse switch is a switch in which a body diode is disposed in a reverse direction serving as a direction reverse to the forward direction of the current. The first FET 10A functions as a first reverse switch when the current flows from the high-voltage battery HV to the high-voltage load 2, and functions as a first forward switch when the current flows from the high-voltage load 2 to the high-voltage battery HV. The first embodiment illustrates an example in which the current flows from the high-voltage battery HV to the high-voltage load 2, and the first FET 10A is explained as the first reverse switch in which a body diode DA is disposed in a direction reverse to the direction of the current flowing from the high-voltage battery HV to the high-voltage load 2. The body diode DA of the first FET 10A includes an anode terminal connected with the high-voltage load 2 side, and a cathode terminal connected with the plus electrode of the high-voltage battery HV. The first FET 10A is driven by the drive unit 20A described later, to transmit or shut off the current flowing from the high-voltage battery HV to the high-voltage load 2.

The second FET 10B is disposed adjacent to the first FET 10A, and functions as a first forward switch or a first reverse switch in accordance with a direction where the current flows. The second FET 10B functions as a first forward switch when the current flows from the high-voltage battery HV to the high-voltage load 2, and functions as a first reverse switch when the current flows from the high-voltage load 2 to the high-voltage battery HV. Because the first embodiment illustrates the example in which the current flows from the high-voltage battery HV to the high-voltage load 2, the second FET 10B is explained as the first forward switch in which a body diode DB is disposed in a forward direction serving as the direction of the current flowing from the high-voltage battery HV to the high-voltage load 2. The body diode DB of the second FET 10B includes an anode terminal connected with the plus electrode side of the high-voltage battery HV, and a cathode terminal connected with the high-voltage load 2. The second FET 10B is driven by the drive unit 20B described later. Source terminals of the second FET 10B and the first FET 10A are connected in series, a drain terminal of the first FET 10A is connected with the high-voltage battery HV, and a drain terminal of the second FET 10B is connected with the high-voltage load 2.

The second bidirectional shutoff circuit 12 includes a FET 10C and a FET 10D. Each of the FETs 10C, 10D is, for example, an N-channel MOSFET. Here, the FET 10C is referred to as a third FET 10C, and the FET 10D is referred to as a fourth FET 10D. The third FET 10C functions as a second forward switch or a second reverse switch, in accordance with the direction in which the current flows. The third FET 10C functions as a second reverse switch when the current flows from the high-voltage battery HV to the high-voltage load 2, and functions as a second forward switch when the current flows from the high-voltage load 2 to the high-voltage battery HV. Because the first embodiment illustrates the example in which the current flows from the high-voltage battery HV to the high-voltage load 2, the third FET 10C is explained as the second reverse switch in which a body diode DC is disposed in a direction reverse to the direction of the current flowing from the high-voltage battery HV to the high-voltage load 2. The body diode DC of the third FET 10C includes an anode terminal connected with the high-voltage load 2 side, and a cathode terminal connected with the plus electrode of the high-voltage battery HV. The third FET 10C is driven by the drive unit 20C described later, to transmit or shut off the current flowing from the high-voltage battery HV to the high-voltage load 2.

The fourth FET 10D is disposed adjacent to the third FET 10C, and functions as a second forward switch or a second reverse switch in accordance with the direction in which the current flows. The fourth FET 10D functions as a second forward switch when the current flows from the high-voltage battery HV to the high-voltage load 2, and functions as a second reverse switch when the current flows from the high-voltage load 2 to the high-voltage battery HV. Because the first embodiment illustrates the example in which the current flows from the high-voltage battery HV to the high-voltage load 2, the fourth FET 10D is explained as the second forward switch in which a body diode DD is disposed in a forward direction serving as the direction of the current flowing from the high-voltage battery HV to the high-voltage load 2. The body diode DD of the fourth FET 10D includes an anode terminal connected with the plus electrode side of the high-voltage battery HV, and a cathode terminal connected with the high-voltage load 2. The fourth FET 10D is driven by the drive unit 20D described later. Source terminals of the fourth FET 10D and the third FET 10C are connected in series, a drain terminal of the third FET 10C is connected with the high-voltage battery HV, and a drain terminal of the fourth FET 10D is connected with the high-voltage load 2. All the first to fourth FETs 10A to 10D are preferably field effect transistor of the same type, to suppress concentration of heat, but are not limited thereto.

The drive unit 20A is connected with a gate terminal of the first FET 10A, to drive the first FET 10A based on an ON/OFF instruction from the controller 50 described later. When the controller 50 outputs an ON instruction to turn on the switch of the first FET 10A, the drive unit 20A applies an ON voltage to the gate terminal of the first FET 10A, to let a current flow from the drain terminal to the source terminal. When the controller 50 outputs an OFF instruction to turn off the switch of the first FET 10A, the drive unit 20A applies an OFF voltage to the gate terminal of the first FET 10A, to shut off the current flowing from the drain terminal to the source terminal.

The drive unit 20B is connected with a gate terminal of the second FET 10B, to drive the second FET 10B based on an ON/OFF instruction from the controller 50. When the controller 50 outputs an ON instruction to turn on the switch of the second FET 10B, the drive unit 20B applies an ON voltage to the gate terminal of the second FET 10B, to let a current flow from the source terminal to the drain terminal. When the controller 50 outputs an OFF instruction to turn off the switch of the second FET 10B, the drive unit 20B applies an OFF voltage to the gate terminal of the second FET 10B, to shut off the current flowing from the source terminal to the drain terminal.

The drive unit 20C is connected with a gate terminal of the third FET 10C, to drive the third FET 10C based on an ON/OFF instruction from the controller 50. When the controller 50 outputs an ON instruction to turn on the switch of the third FET 10C, the drive unit 20C applies an ON voltage to the gate terminal of the third FET 10C, to let a current flow from the drain terminal to the source terminal. When the controller 50 outputs an OFF instruction to turn off the switch of the third FET 10C, the drive unit 20C applies an OFF voltage to the gate terminal of the third FET 10C, to shut off the current flowing from the drain terminal to the source terminal.

The drive unit 20D is connected with a gate terminal of the fourth FET 10D, to drive the fourth FET 10D based on an ON/OFF instruction from the controller 50. When the controller 50 outputs an ON instruction to turn on the switch of the fourth FET 10D, the drive unit 20D applies an ON voltage to the gate terminal of the fourth FET 10D, to let a current flow from the source terminal to the drain terminal. When the controller 50 outputs an OFF instruction to turn off the switch of the fourth FET 10D, the drive unit 20D applies an OFF voltage to the gate terminal of the fourth FET 10D, to shut off the current flowing from the source terminal to the drain terminal.

The resistor R detects a voltage of the semiconductor switch module. One end of the resistor R is connected with a first connection point X between the source terminals of the second FET 10B and the first FET 10A, and the other end of the resistor R is connected with a second connection point Y between the source terminals of the fourth FET 10D and the third FET 10C.

The first voltage detector 30 detects a voltage applied to the resistor R. The first voltage detector 30 outputs a first detected voltage Vd obtained by detecting the voltage applied to the resistor R to the controller 50.

The second voltage detector 40 detects a voltage applied to the high-voltage load 2. The second voltage detector 40 outputs a second detected voltage Vout obtained by detecting the voltage applied to the high-voltage load 2 to the controller 50.

The controller 50 controls the bidirectional shutoff circuit 10 through the drive units 20A to 20D. The controller 50 includes an electronic circuit mainly including a well-known microcomputer including a Central Processing Unit (CPU), a Read Only memory (ROM) and a Random Access Memory (RAM) forming a storage unit, and an interface. The controller 50 outputs an ON/OFF instruction to the drive units 20A to 20D to control the drive units 20A to 20D, for example, based on a semiconductor drive signal output from an external device. The controller 50 also controls the bidirectional shutoff circuit 10, based on the first detected voltage Vd detected by the first voltage detector 30. For example, the controller 50 determines malfunction of the bidirectional shutoff circuit 10, based on the first detected voltage Vd detected by the first voltage detector 30. The controller 50 also determines malfunction of the bidirectional shutoff circuit 10, based on the second detected voltage Vout detected by the second voltage detector 40. For example, when the controller 50 determines that the bidirectional shutoff circuit 10 malfunctions, the controller 50 transmits an abnormality detection signal to power supply management means (not illustrated) or the like, to perform fail-safe processing, such as stopping the power supplied from the high-voltage battery HV with the power supply management means or the like. The controller 50 may include a malfunction determination unit determining malfunction of the bidirectional shutoff circuit 10, and a drive controller driving and controlling the bidirectional shutoff circuit 10, separately.

Figure 2:
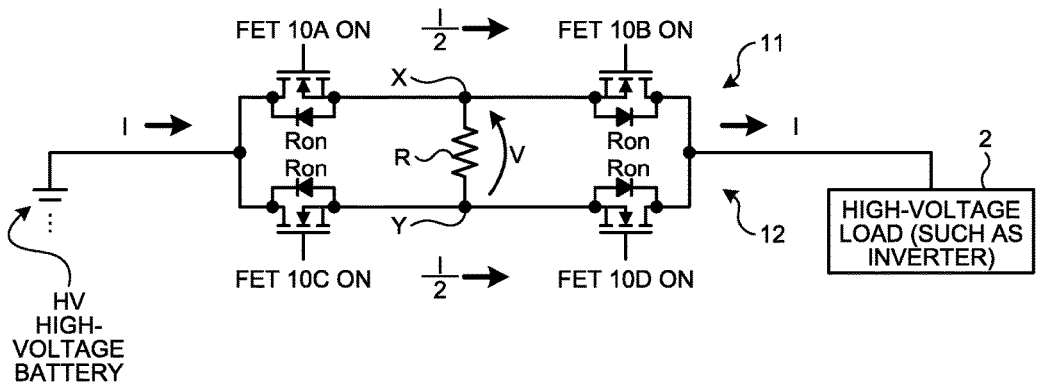
FIG. 2 is a circuit diagram illustrating an operation example of a semiconductor switch module according to the first embodiment.

The following is explanation of an example of malfunction determination performed by the semiconductor switch control device 1. As illustrated in FIG. 2, the semiconductor switch control device 1 outputs an ON instruction to the first to fourth FETs 10A to 10D, to turn on all the first to fourth FETs 10A to 10D. In the semiconductor switch control device 1, when all the first to fourth FETs 10A to 10D are normally turned on, because the first connection point X and the second connection point Y of the resistor R have the same potential, the voltage V applied to the resistor R is 0 V. In this case, in the semiconductor switch control device 1, ½ of a current I flowing from the high-voltage battery HV to the high-voltage load 2 flows through the first bidirectional shutoff circuit 11, and ½ of the current I flows through the second bidirectional shutoff circuit 12.

Figure 3:
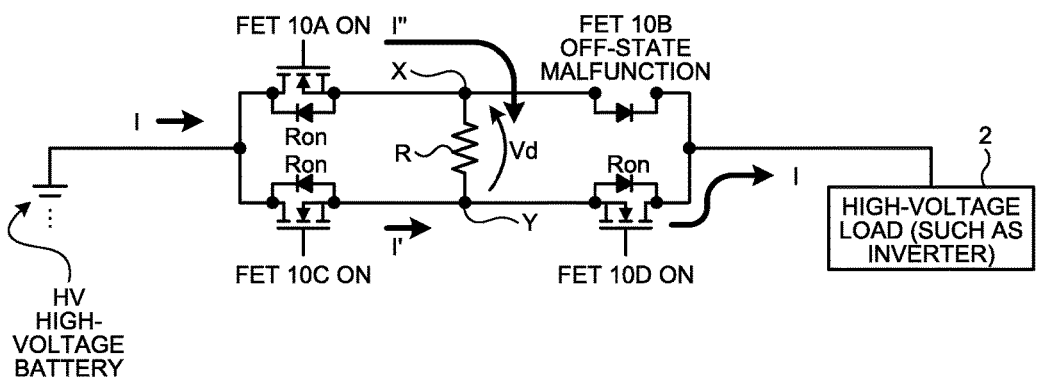
FIG. 3 is a circuit diagram illustrating an example of an OFF-state malfunction of a second FET of the semiconductor switch module according to the first embodiment.

The following is explanation of an example of an OFF-state malfunction in which the second FET 10B is not set to an ON state but maintains an OFF state, as illustrated in FIG. 3. The semiconductor switch control device 1 outputs an ON instruction to the first to fourth FETs 10A to 10D. In the case where the first, third, and fourth FETs 10A, 10C, 10D are normally set to the ON state but the second FET 10B incurs an OFF-state malfunction in which the second FET 10B is not set to the ON state but maintains the OFF state, because the first connection point X and the second connection point Y of the resistor R have different potentials, the first detected voltage Vd is applied to the resistor R. Specifically, in the semiconductor switch control device 1, a voltage drop obtained by adding the voltage drop of the resistor R to the voltage drop of the fourth FET 10D is smaller than the voltage drop of the body diode DB of the second FET 10B. For this reason, in the semiconductor switch control device 1, the first connection point X of the resistor R has a potential higher than that of the second connection point Y of the resistor R, and a current I" flows from the first connection point X of the resistor R to the second connection point Y of the resistor R. In this state, the semiconductor switch control device 1 determines that an OFF-state malfunction occurs, in the case of detecting the first detected voltage Vd applied to the resistor R. For example, when the shift amount between the first detected voltage Vd and a predetermined first reference voltage is a positive voltage, the semiconductor switch control device 1 determines that an OFF-state malfunction occurs in the second FET 10B. The current I" is determined as "(Ron/(Ron+R+Ron)×I". R is a resistance, Ron is a resistance when the first to fourth FETs 10A to 10D are in the ON state, and I is a current supplied from the high-voltage battery HV.

Figure 4:
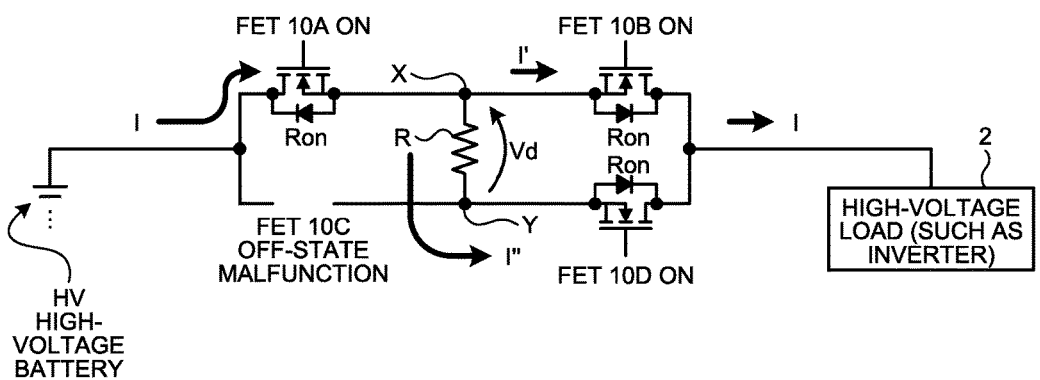
FIG. 4 is a circuit diagram illustrating an example of an OFF-state malfunction of a third FET of the semiconductor switch module according to the first embodiment.

The following is explanation of an example of an OFF-state malfunction in which the third FET 10C is not set to the ON state but maintains the OFF state, as illustrated in FIG. 4. The semiconductor switch control device 1 outputs an ON instruction to the first to fourth FETs 10A to 10D. In the case where the first, second, and fourth FETs 10A, 10B, and 10D are normally set to the ON state but the third FET 10C incurs an OFF-state malfunction, because the first connection point X and the second connection point Y of the resistor R have different potentials, the first detected voltage Vd is applied to the resistor R. Specifically, in the semiconductor switch control device 1, because no current flows through the third FET 10C, the first connection point X of the resistor R has a potential higher than that of the second connection point Y of the resistor R, and a current I" flows from the first connection point X of the resistor R to the second connection point Y of the resistor R. In this state, the semiconductor switch control device 1 determines that an OFF-state malfunction occurs, in the case of detecting the first detected voltage Vd applied to the resistor R. For example, when the shift amount between the first detected voltage Vd and the first reference voltage is a positive voltage, the semiconductor switch control device 1 determines that an OFF-state malfunction occurs in the third FET 10C. As illustrated in FIG. 3 and FIG. 4, the semiconductor switch control device 1 is capable of determining that an OFF-state malfunction occurs in one of the second FET 10B and the third FET 10C by detecting the plus first detected voltage Vd as a positive voltage, but is not capable of specifying which of the FET second 10B and the third FET 10C incurs the OFF-state malfunction. The semiconductor switch control device 1 specifies which of the second FET 10B and the third FET 10C incurs the OFF-state malfunction, using a method for determining ON-state malfunction described later in combination.

Figure 5:
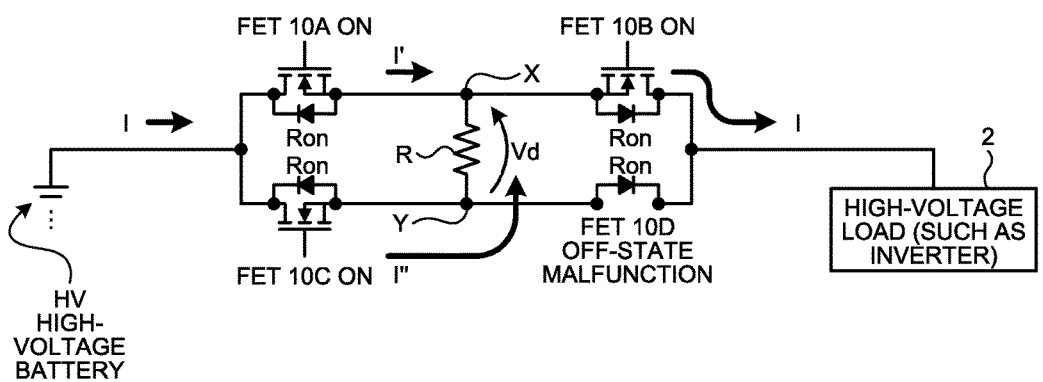
FIG. 5 is a circuit diagram illustrating an example of an OFF-state malfunction of a fourth FET of the semiconductor switch module according to the first Embodiment.

The following is explanation of an example of an OFF-state malfunction in which the fourth FET 10D is not set to the ON state but maintains the OFF state, as illustrated in FIG. 5. The semiconductor switch control device 1 outputs an ON instruction to the first to fourth FETs 10A to 10D. In the case where the first, second, and third FETs 10A, 10B, 10C are normally set to the ON state but the fourth FET 10D incurs an OFF-state malfunction, because the first connection point X and the second connection point Y of the resistor R have different potentials, the first detected voltage Vd is applied to the resistor R. Specifically, in the semiconductor switch control device 1, because a voltage drop obtained by adding the voltage drop of the resistor R to the voltage drop of the second FET 10B is smaller than the voltage drop of the body diode DD of the fourth FET 10D, the second connection point Y of the resistor R has a potential higher than that of the first connection point X of the resistor R, and a current I" flows from the second connection point Y of the resistor R to the first connection point X of the resistor R. In this state, the semiconductor switch control device 1 determines that an OFF-state malfunction occurs, in the case of detecting the first detected voltage Vd applied to the resistor R. For example, when the shift amount between the first detected voltage Vd and the first reference voltage is a negative voltage, the semiconductor switch control device 1 determines that an OFF-state malfunction occurs in the fourth FET 10D.

Figure 6:
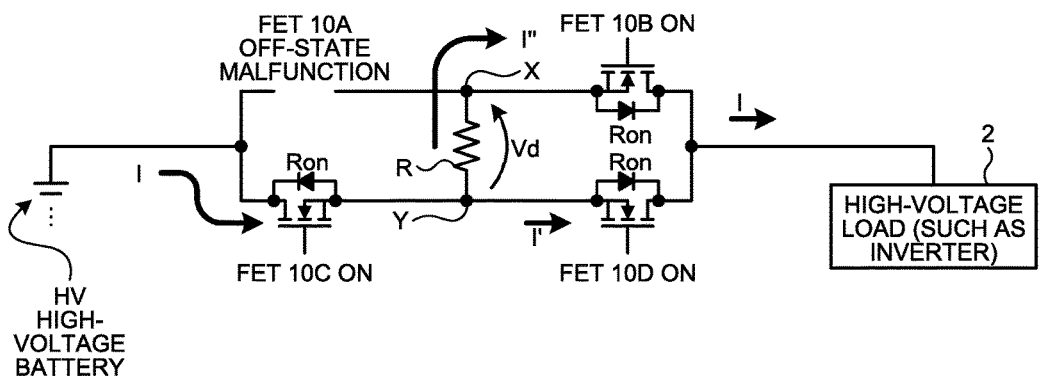
FIG. 6 is a circuit diagram illustrating an example of an OFF-state malfunction of a first FET of the semiconductor switch module according to the first embodiment.

The following is explanation of an example of an OFF-state malfunction in which the first FET 10A is not set to the ON state but maintains the OFF state, as illustrated in FIG. 6. The semiconductor switch control device 1 outputs an ON instruction to the first to fourth FETs 10A to 10D. In the case of where the second, third, and fourth FETs 10B, 10C, 10D are normally set to the ON state and the first FET 10A incurs an OFF-state malfunction, because the first connection point X and the second connection point Y of the resistor R have different potentials, the first detected voltage Vd is applied to the resistor R. Specifically, in the semiconductor switch control device 1, because no current flows through the first FET 10A, the second connection point Y of the resistor R has a potential higher than that of the first connection point X of the resistor R, and a current I" flows from the second connection point Y of the resistor R to the first connection point X of the resistor R. In this state, the semiconductor switch control device 1 determines that an OFF-state malfunction occurs, in the case of detecting the first detected voltage Vd applied to the resistor R. For example, when the shift amount between the first detected voltage Vd and the first reference voltage is a negative voltage, the semiconductor switch control device 1 determines that an OFF-state malfunction occurs in the first FET 10A. As illustrated in FIG. 5 and FIG. 6, the semiconductor switch control device 1 is capable of determining that an OFF-state malfunction occurs in one of the first FET 10A and the fourth FET 10D by detecting the minus first detected voltage Vd as a negative voltage, but is not capable of specifying which of the first FET 10A and the fourth FET 10D incurs the OFF-state malfunction. The semiconductor switch control device 1 specifies which of the first FET 10A and the fourth FET 10D incurs the OFF-state malfunction, using a method for determining an ON-state malfunction described later in combination.

Figure 7:
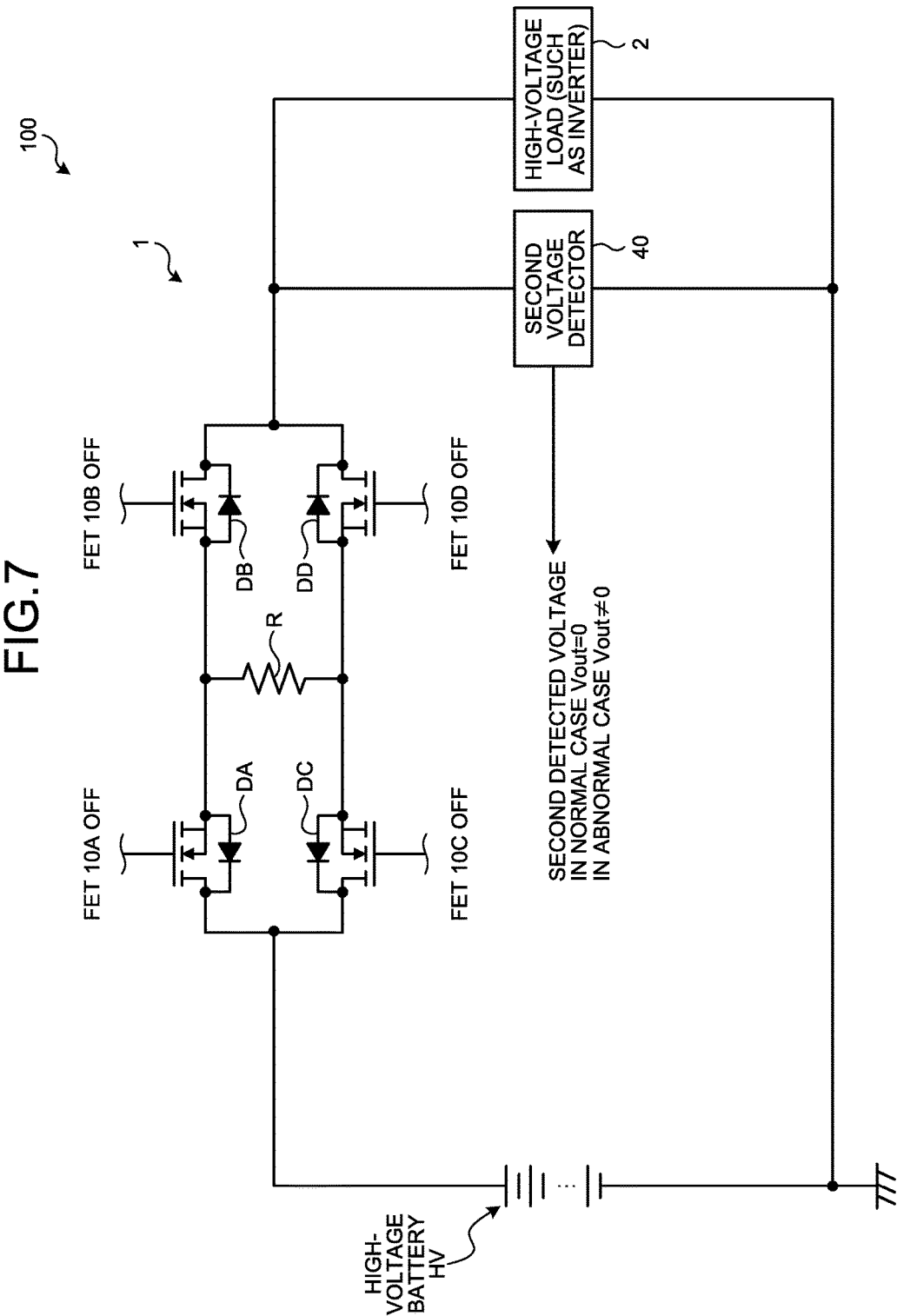
FIG. 7 is a circuit diagram illustrating an example of determination of an ON-state malfunction of the semiconductor switch module according to the first embodiment.

The following is explanation of an example of determining an ON-state malfunction in which the first to fourth FETs 10A to 10D are not set to the OFF state but maintain the ON state, using the second detected voltage Vout detected by the second voltage detector 40. As illustrated in FIG. 7, the semiconductor switch control device 1 outputs an OFF instruction to the first to fourth FETs 10A to 10D. When the second detected voltage Vout exceeds a reference voltage (for example, 0 V), the semiconductor switch control device 1 determines that at least one of the first FET 10A and the second FET 10B incurs an ON-state malfunction in which the one FET is not set to the OFF state but maintains the ON state. The semiconductor switch control device 1 also outputs an OFF instruction to the first to fourth FETs 10A to 10D. When the second detected voltage Vout is a reference voltage (for example, 0 V), because the first FET 10A and the second FET 10B are set to an OFF state, the semiconductor switch control device 1 determines that the first and second FETs 10A, 10B are normal. FIG. 7 illustrates a part related to processing to determine an ON-state malfunction, and illustration of the other parts is omitted.

Figure 8:
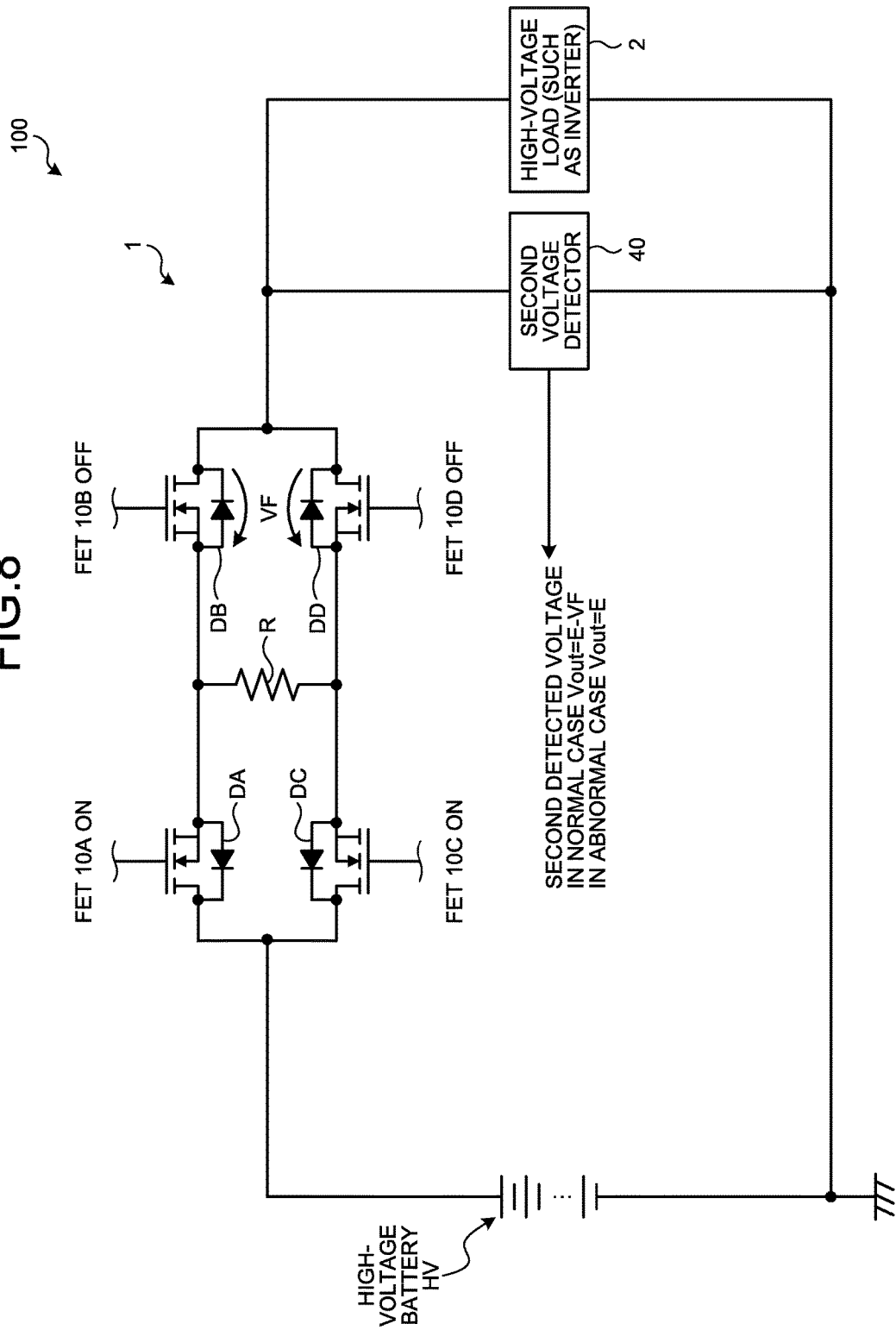
FIG. 8 is a circuit diagram illustrating an example of determination of an ON-state malfunction of the semiconductor switch module according to the first embodiment.
Figure 9:
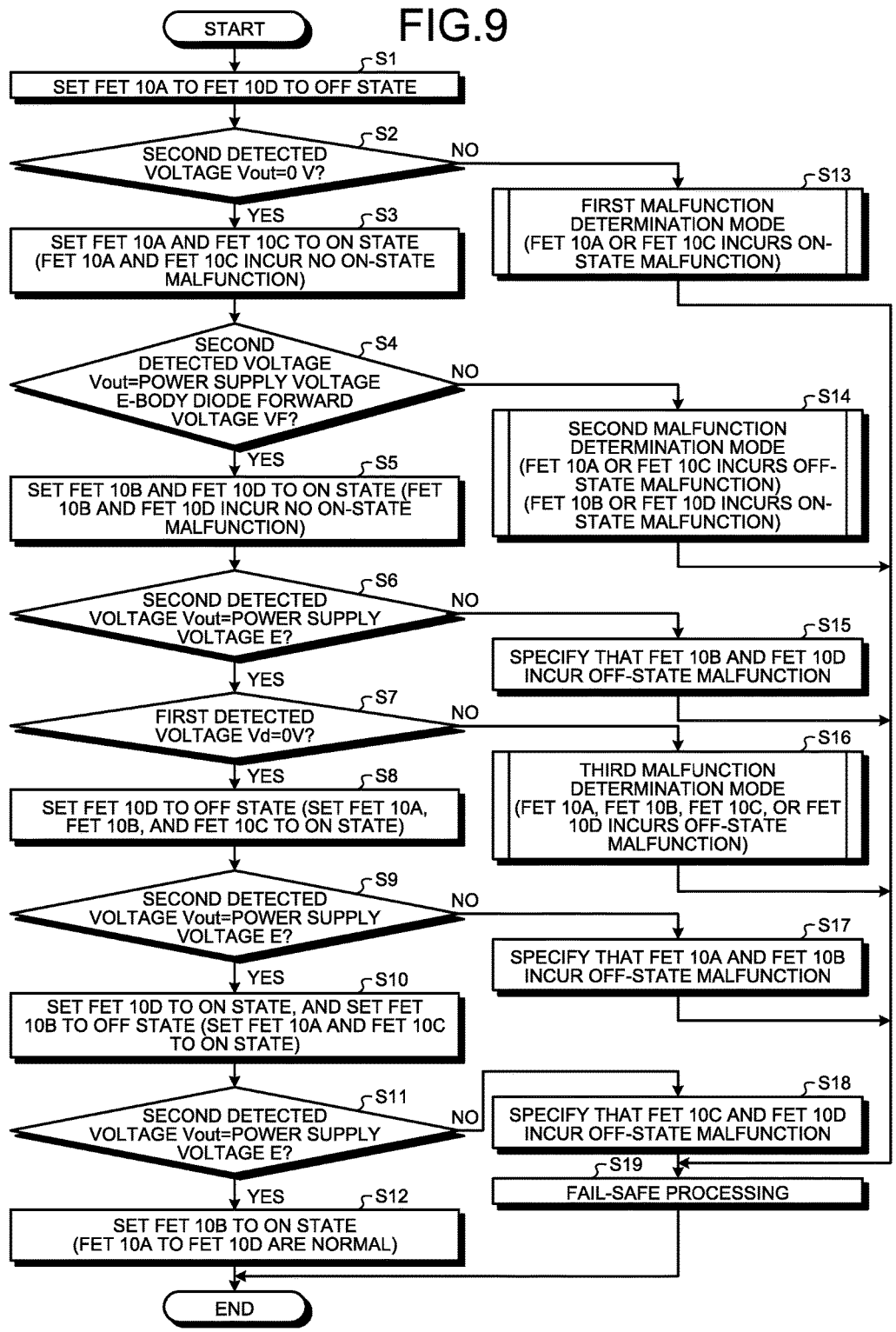
FIG. 9 is a flowchart illustrating an operation example of the semiconductor switch control device according to the first embodiment.
Figure 10:
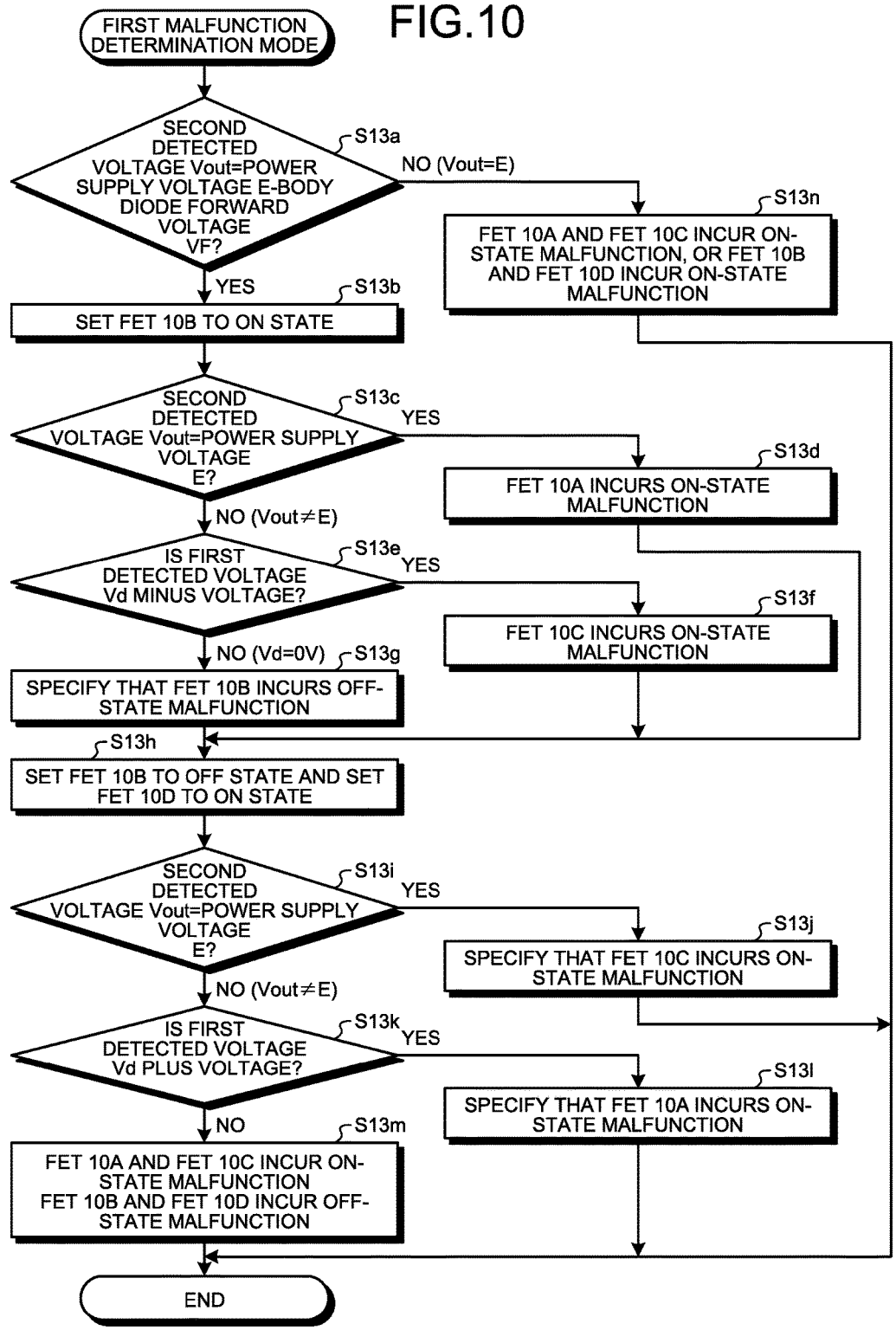
FIG. 10 is a flowchart illustrating an operation example (first malfunction determination mode) of the semiconductor switch control device according to the first embodiment.
Figure 11:
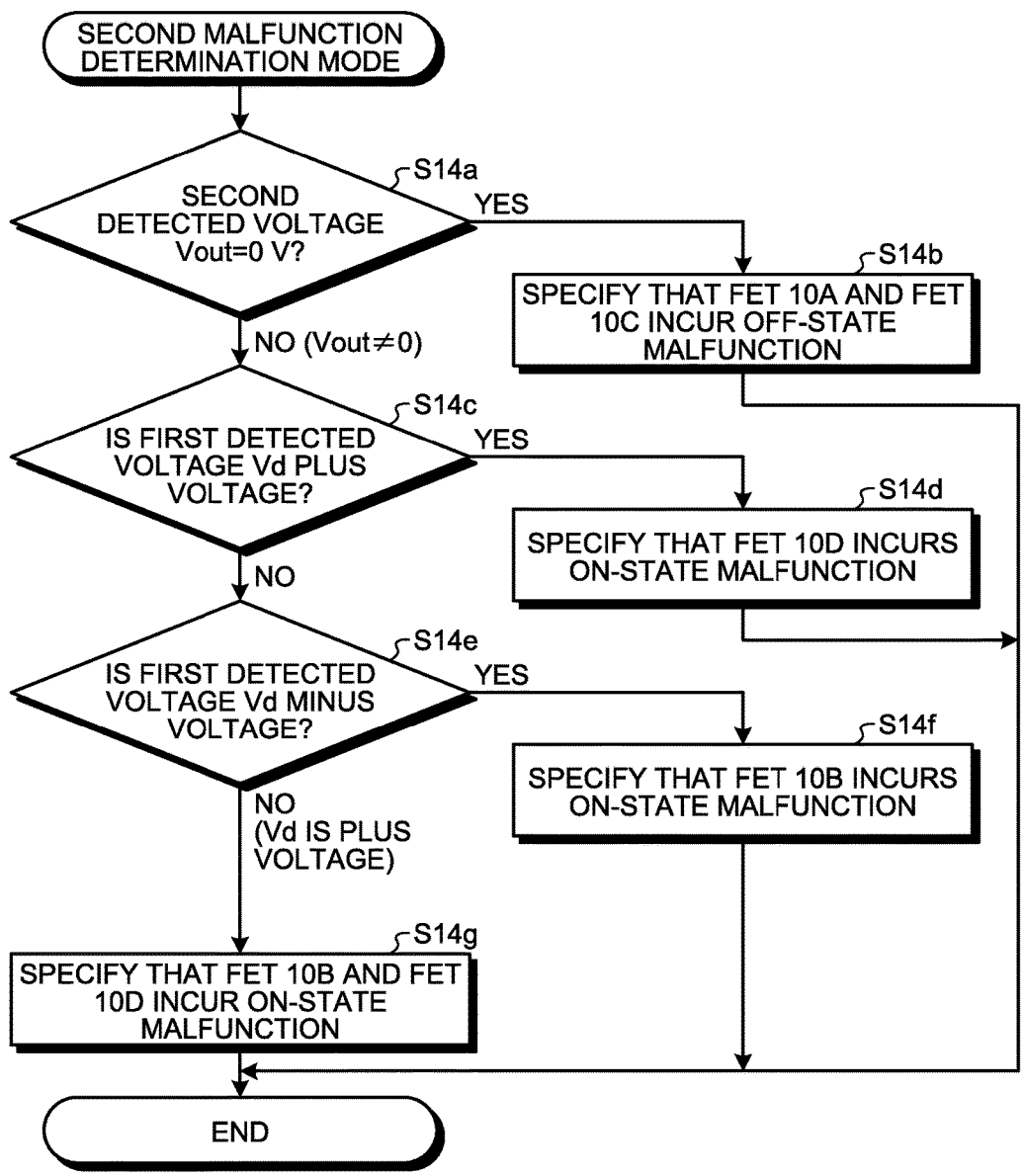
FIG. 11 is a flowchart illustrating an operation example (second malfunction determination mode) of the semiconductor switch control device according to the first embodiment.
Figure 12:
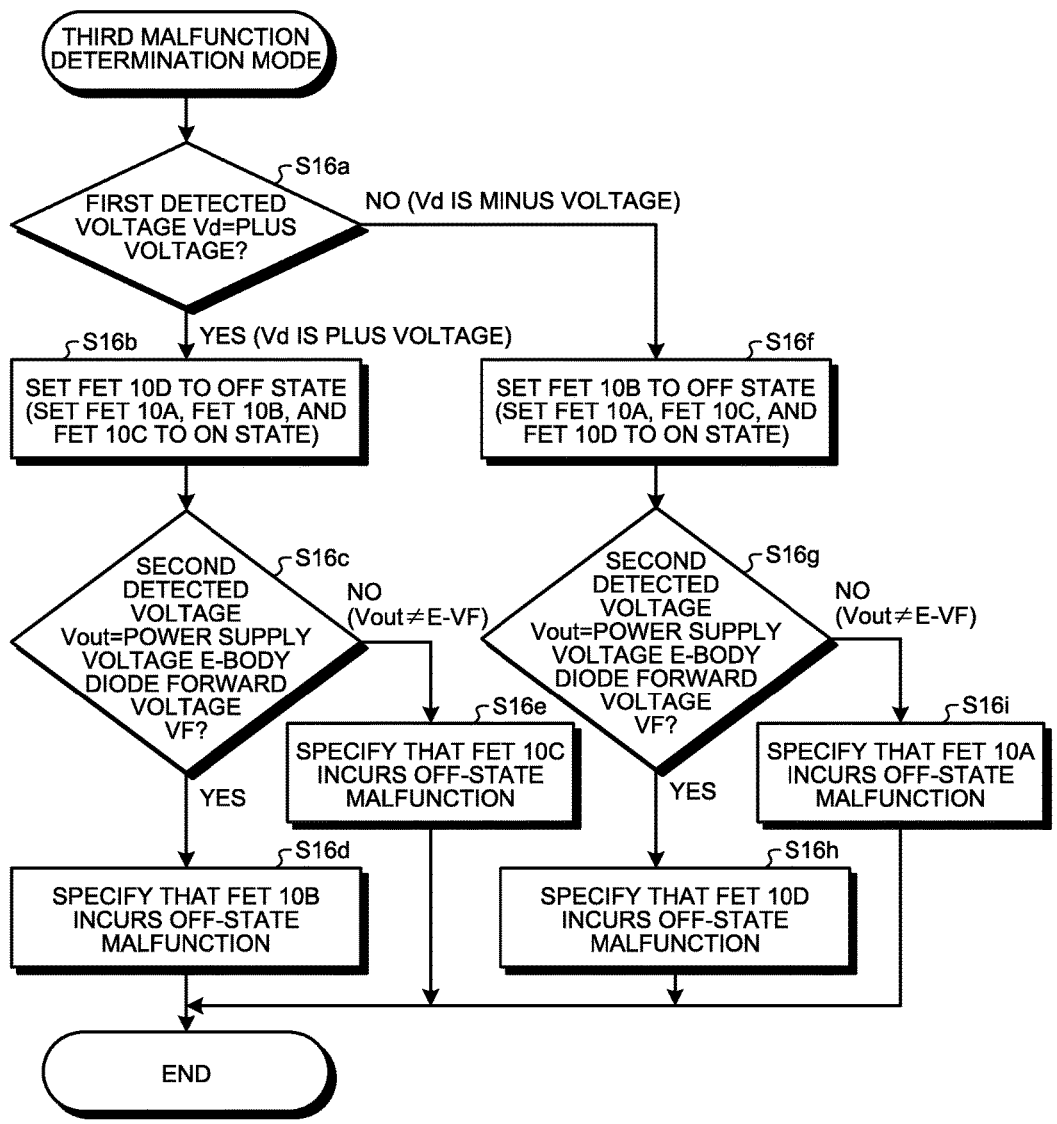
FIG. 12 is a flowchart illustrating an operation example (third malfunction determination mode) of the semiconductor switch control device according to the first embodiment.
Figure 13:
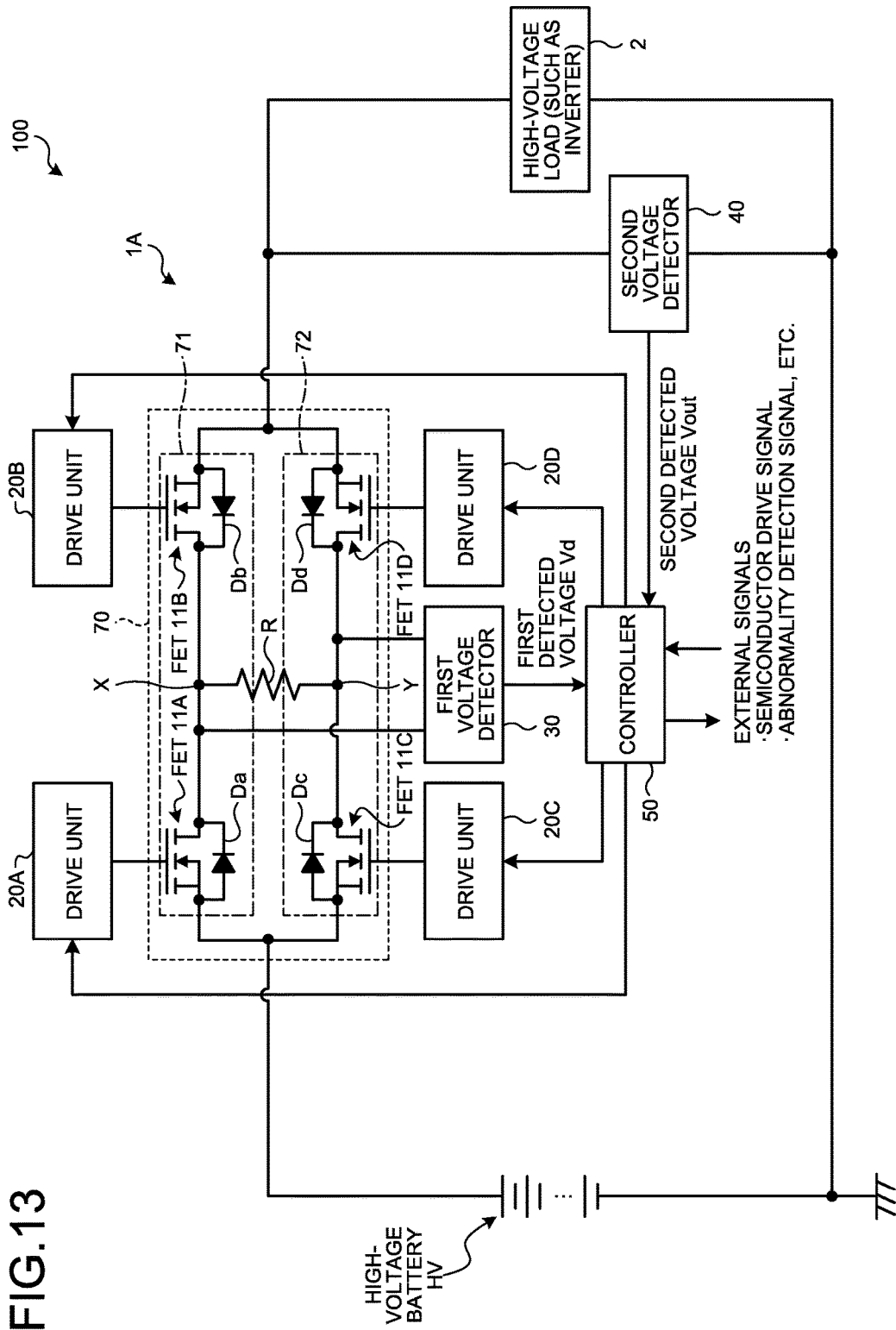
FIG. 13 is a block diagram illustrating a configuration example of a semiconductor switch control device according to a second embodiment.
Figure 14:
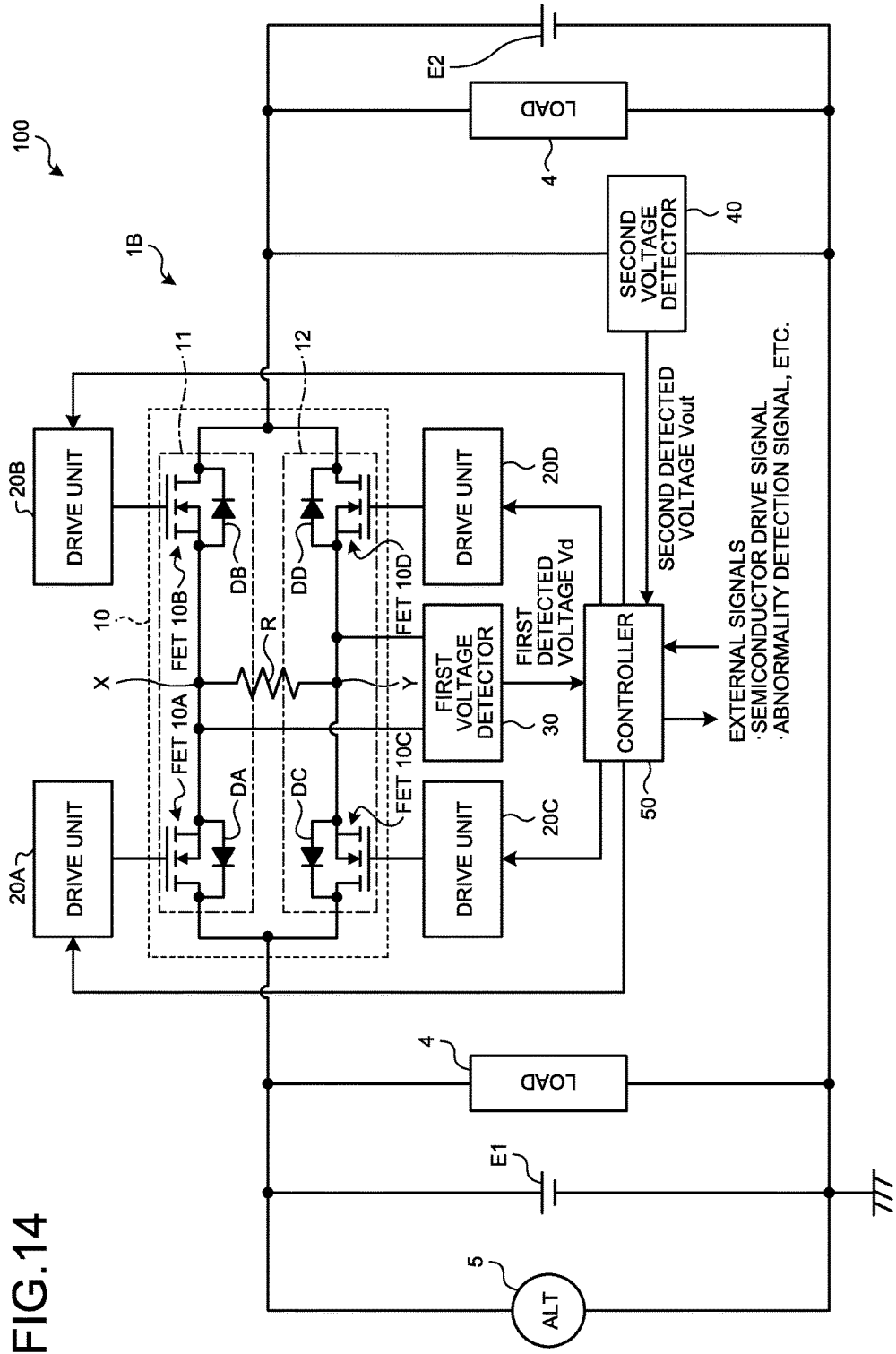
FIG. 14 is a block diagram illustrating a configuration example of a semiconductor switch control device according to a third embodiment.

As illustrated in FIG. 8, the semiconductor switch control device 1 outputs an ON instruction to the first FET 10A and the third FET 10C, and outputs an OFF instruction to the second FET 10B and the fourth FET 10D. When the second detected voltage Vout is equal to the reference voltage (voltage of the high-voltage battery HV), the semiconductor switch control device 1 determines that at least one of the second FET 10B and the fourth FET 10D incurs an ON-state malfunction in which the one FET is not set to the OFF state but maintains the ON state. The semiconductor switch control device 1 outputs an ON instruction to the first FET 10A and the third FET 10C, and an OFF instruction to the second FET 10B and the fourth FET 10D, and determines that the second and fourth FETs 10B, 10D are normally set to the OFF state, when the second detected voltage Vout is not equal to the reference voltage (such as the voltage of the high-voltage battery HV) and a voltage drop occurs in the body diodes DB and DD of the second and fourth FETs 10B, 10D. FIG. 8 illustrates a part related to processing to determine an ON-state malfunction, and illustration of the other parts is omitted.

The following is explanation of an operation example of the semiconductor switch control device 1, with reference to FIG. 9 to FIG. 12. The controller 50 of the semiconductor switch control device 1 sets the first to fourth FETs 10A to 10D to the OFF state (Step S1). Thereafter, the controller 50 determines whether the second detected voltage Vout is 0 V. When the second detected voltage Vout is 0 V (Yes at Step S2), the controller 50 determines that no ON-state malfunction occurs, in which the first and third FETs 10A, 10C are not set to the OFF state but maintains the ON state. The controller 50 sets the first and third FETs 10A, 10C to the ON state (Step S3). In Step S3, the first and third FETs 10A, 10C are in the ON state, and the second and fourth FETs 10B, 10D are in the OFF state. Thereafter, in Step S4, the controller 50 determines whether the second detected voltage Vout is equal to a voltage obtained by subtracting a forward voltage VF of the body diodes of the second and fourth FETs 10B, 10D from a power supply voltage E serving as the voltage of the high-voltage battery HV (determines whether "Vout=E−VF" is satisfied). When "Vout=E−VF" is satisfied (Yes in Step S4), the controller 50 determines that no ON-state malfunction occurs in the second FET 10B or the fourth FET 10D. Thereafter, the controller 50 sets the second and fourth FETs 10B, 10D to the ON state (Step S5). In Step S5, the first to fourth FETs 10A to 10D are in the ON state. Thereafter, the controller 50 determines whether the second detected voltage Vout is equal to the power supply voltage E (Step S6). When the second detected voltage Vout is equal to the power supply voltage E (Yes in Step S6), the controller 50 determines whether the first detected voltage Vd is 0 V (Step S7). When the first detected voltage Vd is 0 V (Yes in Step S7), the controller 50 sets the fourth FET 10D to the OFF state (Step S8). In Step S8, the first and third FETs 10A, 10C are in the ON state, and the fourth FET 10D is in the OFF state. Thereafter, the controller 50 determines whether the second detected voltage Vout is equal to the power supply voltage E (Step S9). When the second detected voltage Vout is equal to the power supply voltage E (Yes in Step S9), the controller 50 sets the fourth FET 10D to the ON state, and sets the second FET 10B to the OFF state (Step S10). In Step S10, the first, third, and fourth FETs 10A, 10C, 10D are in the ON state, and the second FET 10B is in the OFF state. Thereafter, the controller 50 determines whether the second detected voltage Vout is equal to the power supply voltage E (Step S11). When the second detected voltage Vout is equal to the power supply voltage E (Yes in Step S11), the controller 50 determines that all the first to fourth FETs 10A to 10D are normal, sets the second FET 10B to the ON state (Step S12), and ends the malfunction determination processing.

In Step S6 described above, when the second detected voltage Vout is not equal to the power supply voltage E (No in Step S6), the controller 50 determines that the second FET 10B and the fourth FET 10D incur an OFF-state malfunction (Step S15). In Step S15, because the second and fourth FETs 10B, 10D incur the OFF-state malfunction and the forward voltage VF occurs in the body diodes of the second and fourth FETs 10B, 10D, the second detected voltage Vout is not equal to the power supply voltage E. Thereafter, the controller 50 performs fail-safe processing, because the second and fourth FETs 10B, 10D malfunction (Step S19). For example, the controller 50 transmits an abnormality detection signal to the power supply management means or the like, to stop the power supplied from the high-voltage battery HV, with the power supply management means or the like.

In Step S9 described above, when the second detected voltage Vout is not equal to the power supply voltage E (No in Step S9), the controller 50 specifies that the first FET 10A and the second FET 10B incur an OFF-state malfunction (Step S17). In Step S17, the first and second FETs 10A, 10B incur an OFF-state malfunction, and the forward voltage VF occurs in the body diodes of the second and fourth FETs 10B, 10D. For this reason, the second detected voltage Vout is not equal to the power supply voltage E.

In addition, in Step S11 described above, when the second detected voltage Vout is not equal to the power supply voltage E (No in Step S11), the controller 50 specifies that the third FET 10C and the fourth FET 10D incur an OFF-state malfunction (Step S18). In Step S18, the third and fourth FETs 10C, 10D incur an OFF-state malfunction, and the forward voltage VF occurs in the body diodes of the second and fourth FETs 10B, 10D. For this reason, the second detected voltage Vout is not equal to the power supply voltage E.

First Malfunction Determination Mode

In Step S2 described above, when the second detected voltage Vout is not 0 V (No in Step S2), the controller 50 determines that the first FET 10A or the third FET 10C incurs an ON-state malfunction, and performs a first malfunction determination mode (Step S13). The first malfunction determination mode is executed in accordance with the flowchart illustrated in FIG. 10. In Step S13a, the controller 50 determines whether the second detected voltage Vout is equal to a voltage obtained by subtracting the forward voltage VF of the body diodes of the second and fourth FETs 10B, 10D from the power supply voltage E (determines whether "Vout=E−VF" is satisfied). When "Vout=E−VF" is satisfied (Yes in Step S13a), the controller 50 sets the second FET 10B to the ON state (Step S13b). In Step S13b, the first, third, and fourth FETs 10A, 10C, 10D are in the OFF state, and the second FET 10B is in the ON state. Thereafter, the controller 50 determines whether the second detected voltage Vout is equal to the power supply voltage E (Step S13c). When the second detected voltage Vout is equal to the power supply voltage E (Yes in Step S13c), the controller 50 estimates that the first FET 10A incurs an ON-state malfunction (Step S13d). When the second detected voltage Vout is not equal to the power supply voltage E (No in Step S13c), the controller 50 determines whether the first detected voltage Vd is a minus voltage (Step S13e). When the first detected voltage Vd is a minus voltage (Yes in Step S13e), the controller 50 estimates that the third FET 10C incurs an ON-state malfunction (Step S13f). When the first detected voltage Vd is not a minus voltage but 0 V (No in Step S13e), the controller 50 specifies that the second FET 10B incurs an OFF-state malfunction (Step S13g). Thereafter, the controller 50 sets the second FET 10B to the OFF state, and sets the fourth FET 10D to the ON state (Step S13h). In Step S13h, the first, second, and third FETs 10A, 10B, 10C are in the OFF state, and the fourth FET 10D is in the ON state. Thereafter, the controller 50 determines whether the second detected voltage Vout is equal to the power supply voltage E (Step S13i). When the second detected voltage Vout is equal to the power supply voltage E (Yes in Step S13i), the controller 50 specifies that the third FET 10C incurs an ON-state malfunction (Step S13j). When the second detected voltage Vout is not equal to the power supply voltage E (No in Step S13i), the controller 50 determines whether the first detected voltage Vd is a plus voltage (Step S13k). When the first detected voltage Vd is a plus voltage (Yes in Step S13k), the controller 50 specifies that the first FET 10A incurs an ON-state malfunction (Step S13*l*). When the first detected voltage Vd is not a plus voltage (No in Step S13*k*), the controller 50 estimates that the first and third FETs 10A, 10C incur an ON-state malfunction, and the second and fourth FETs 10B, 10D incur an OFF-state malfunction (Step S13*m*). In Step S13*a* described above, when "Vout=E−VF" is not satisfied (No in Step S13*a*), the controller 50 estimates that the first and third FETs 10A, 10C incur an ON-state malfunction, or the second and fourth FETs 10B, 10D incur an ON-state malfunction (Step S13*n*).

Second Malfunction Determination Mode

In Step S4 described above, when "Vout=E−VF" is not satisfied (No in Step S4), the controller 50 estimates that the first and third FETs 10A, 10C incur an OFF-state malfunction, or the second and fourth FETs 10B, 10D incur an ON-state malfunction, and performs a second malfunction determination mode (Step S14). The second malfunction determination mode is executed in accordance with the flowchart illustrated in FIG. 11. The controller 50 determines whether the second detected voltage Vout is 0 V (Step S14*a*). When the second detected voltage Vout is 0 V (Yes in Step S14*a*), the controller 50 specifies that the first and third FETs 10A, 10C incur an OFF-state malfunction (Step S14*b*). When the second detected voltage Vout is not 0 V (No in Step S14*a*), the controller 50 determines whether the first detected voltage Vd is a plus voltage (Step S14*c*). When the first detected voltage Vd is a plus voltage (Yes in Step S14*c*), the controller 50 specifies that the fourth FET 10D incurs an ON-state malfunction (Step S14*d*). When the first detected voltage Vd is not a plus voltage (No in Step S14*c*), the controller 50 determines whether the first detected voltage Vd is a minus voltage (Step S14*e*). When the first detected voltage Vd is a minus voltage (Yes in Step S14*e*), the controller 50 specifies that the second FET 10B incurs an ON-state malfunction (Step S14*f*). When the first detected voltage Vd is not a minus voltage (No in Step S14*e*), the controller 50 specifies that the second and fourth FETs 10B, 10D incur an ON-state malfunction (Step S14*g*). When any malfunction is specified in the first to fourth FETs 10A to 10D in the second malfunction determination mode, the controller 50 performs the fail-safe processing illustrated in FIG. 9 (Step S19).

Third Malfunction Determination Mode

In Step S7 described above, when the first detected voltage Vd is not 0 V (No in Step S7), the controller 50 estimates that the first, second, and third FET 10A, 10B, 10C, or the fourth FET 10D incurs an OFF-state malfunction, and performs a third malfunction determination mode (Step S16). The third malfunction determination mode is executed in accordance with the flowchart illustrated in FIG. 12. The controller 50 determines whether the first detected voltage Vd is a plus voltage (Step S16*a*). When the first detected voltage Vd is a plus voltage (Yes in Step S16*a*), the controller 50 sets the fourth FET 10D to the OFF state (Step S16*b*). In Step S16*b*, the first to third FETs 10A to 10C are in the ON state, and the fourth FET 10D is in the OFF state. Thereafter, in Step S16*c*, the controller 50 determines whether the second detected voltage Vout is equal to a voltage obtained by subtracting the forward voltage VF of the body diodes of the third and fourth FETs 10B, 10D from the power supply voltage E (determines whether "Vout=E−VF" is satisfied). When "Vout=E−VF" is satisfied (Yes in Step S16*c*), the controller 50 specifies that the second FET 10B incurs an OFF-state malfunction (Step S16*d*). When "Vout=E−VF" is not satisfied (No in Step S16*c*), the controller 50 specifies that the fourth FET 10C incurs an OFF-state malfunction (Step S16*e*).

In Step S16*a* described above, when the first detected voltage Vd is not a plus voltage (No in Step S16*a*), the controller 50 sets the second FET 10B to the OFF state (Step S16*f*). In Step S16*f*, the first, third, and fourth FETs 10A, 10C, 10D are in the ON state, and the second FET 10B is in the OFF state. Thereafter, in Step S16*g*, the controller 50 determines whether the second detected voltage Vout is equal to a voltage obtained by subtracting the forward voltage VF of the body diodes of the second and fourth FETs 10B, 10D from the power supply voltage E (determines whether "Vout=E−VF" is satisfied). When "Vout=E−VF" is satisfied (Yes in Step S16*g*), the controller 50 specifies that the fourth FET 10D incurs an OFF-state malfunction (Step S16*h*). When "Vout=E−VF" is not satisfied (No in Step S16*g*), the controller 50 specifies that the first FET 10A incurs an OFF-state malfunction (Step S16*i*). When any malfunction in the first to fourth FETs 10A to 10D is specified in the third malfunction determination mode, the controller 50 performs the fail-safe processing illustrated in FIG. 9 (Step S19).

As described above, the semiconductor switch control device 1 according to the first embodiment includes a bidirectional shutoff circuit 10 installed between the high-voltage battery HV and the high-voltage load 2 and transmitting or shutting off a current flowing bidirectionally between the high-voltage battery HV and the high-voltage load 2, the resistor R to detect a voltage of the bidirectional shutoff circuit 10, the first voltage detector 30 detecting a voltage applied to the resistor R, and the controller 50 determining malfunction of the bidirectional shutoff circuit 10, based on a first detected voltage Vd detected by the first voltage detector 30. The bidirectional shutoff circuit 10 includes the FET second 10B and the first FET 10A including respective source terminals connected in series, and the fourth FET 10D and the third FET 10C including respective source terminals connected in series. One end of the resistor R is connected between the source terminals of the second FET 10B and the first FET 10A, and the other end of the resistor R is connected between the source terminals of the fourth FET 10D and the third FET 10C. With the structure, the semiconductor switch control device 1 is capable of determining an OFF-state malfunction of any of the first to fourth FETs 10A to 10D, by detecting the voltage applied to the resistor R. Accordingly, the semiconductor switch control device 1 is capable of determining malfunction of the bidirectional shutoff circuit 10 using one resistor R, and suppresses an increase in the size of the device. The semiconductor switch control device 1 has a structure in which no resistor R is disposed in the main current path through which the current flows, and suppresses loss due to energization. The semiconductor switch control device 1 is also capable of improving reliability of the vehicle power system 100 by determination of malfunction of the first to fourth FETs 10A to 10D.

In addition, in the semiconductor switch control device 1, when an instruction is issued to turn on all the first to fourth FETs 10A to 10D, the controller 50 determines that any of the first to fourth FETs 10A to 10D incurs an OFF-state malfunction in which the FET is in the OFF state, based on the shift amount between the first detected voltage Vd and the predetermined first reference voltage. In this manner, the semiconductor switch control device 1 is enabled to determine that any of the first to fourth FETs 10A to 10D incurs an OFF-state malfunction, and shorten the time for determining malfunction, in comparison with the case of determining malfunction of each of the first to fourth FETs 10A to 10D separately.

In addition, in the semiconductor switch control device 1, the controller 50 determines that either of the second FET 10B and the third FET 10C incurs an OFF-state malfunction when the shift amount between the first detected voltage Vd and the first reference voltage is a positive voltage, and determines that either of the first FET 10A and the fourth FET 10D incurs an OFF-state malfunction when the shift amount between the first detected voltage Vd and the first reference voltage is a negative voltage. In this manner, the semiconductor switch control device 1 is enabled to narrow down the first to fourth FETs 10A to 10D incurring an OFF-state malfunction, and easily specify the first to fourth FETs 10A to 10D incurring an OFF-state malfunction.

In the semiconductor switch control device 1, the controller 50 determines malfunction of the bidirectional shutoff circuit 10, based on the second detected voltage Vout detected by the second voltage detector 40. For example, the semiconductor switch control device 1 determines an ON-state malfunction in which any of the first to fourth FETs 10A to 10D is in the ON state, based on the second detected voltage Vout. In this manner, the semiconductor switch control device 1 is enabled to determine an ON-state malfunction, and determine malfunction of the first to fourth FETs 10A to 10D more specifically.

In the semiconductor switch control device 1, the controller 50 specifies which of the first to fourth FETs 10A to 10D incurs an OFF-state malfunction, based on the second detected voltage Vout detected by the second voltage detector 40, and instruction values to turn on/off the first to fourth FETs 10A to 10D, in an OFF-state malfunction of the bidirectional shutoff circuit 10. In this manner, the semiconductor switch control device 1 is enabled to specify which of the first to fourth FETs 10A to 10D incurs an OFF-state malfunction, and facilitate the recovery work.

The semiconductor switch control device 1 may include a plurality of bidirectional shutoff circuits 10 to make the device redundant, and improve the reliability of the vehicle power system 100.

Second Embodiment

The following is explanation of a semiconductor switch control device 1A according to a second embodiment 2. The semiconductor switch control device 1A according to the second embodiment is different from the semiconductor switch control device 1 of the first embodiment, in that drain terminals are connected in the second embodiment. In the second embodiment, constituent elements equal to those of the first embodiment are denoted by the same reference numerals, and detailed explanation thereof is omitted. The semiconductor switch control device 1A includes a bidirectional shutoff circuit 70 including a first bidirectional shutoff circuit 71 and a second bidirectional shutoff circuit 72. The first bidirectional shutoff circuit 71 and the second bidirectional shutoff circuit 72 are connected in parallel. The first bidirectional shutoff circuit 71 includes a FET 11A and a FET 11B, and the second bidirectional shutoff circuit 72 includes a FET 11C and a FET 11D. Here, the FET 11A is referred to as a first FET, the FET 11B is referred to as a second FET, the FET 11C is referred to as a third FET, and the FET 11D is referred to as a fourth FET.

The first FET 11A functions as a first forward switch when a current flows from the high-voltage battery HV to the high-voltage load 2, and functions as a first reverse switch when a current flows from the high-voltage load 2 to the high-voltage battery HV. A body diode Da of the first FET 11A includes an anode terminal connected with a plus electrode of the high-voltage battery HV, and a cathode terminal connected with the high-voltage load 2 side.

The second FET 11B functions as a first reverse switch when a current flows from the high-voltage battery HV to the high-voltage load 2, and functions as a first forward switch when a current flows from the high-voltage load 2 to the high-voltage battery HV. A body diode Db of the second FET 11B includes an anode terminal connected with the high-voltage load 2, and a cathode terminal connected with the plus electrode side of the high-voltage battery HV. Drain terminals of the second FET 11B and the first FET 11A are connected in series, a source terminal of the first FET 11A is connected with the high-voltage battery HV, and a source terminal of the second FET 11B is connected with the high-voltage load 2.

The third FET 11C functions as a first forward switch when a current flows from the high-voltage battery HV to the high-voltage load 2, and functions as a first reverse switch when a current flows from the high-voltage load 2 to the high-voltage battery HV. A body diode Dc of the third FET 11C includes an anode terminal connected with the plus electrode of the high-voltage battery HV, and a cathode terminal connected with the high-voltage load 2 side.

The fourth FET 11D functions as a first reverse switch when a current flows from the high-voltage battery HV to the high-voltage load 2, and functions as a first forward switch when a current flows from the high-voltage load 2 to the high-voltage battery HV. A body diode Dd of the fourth FET 11D includes an anode terminal connected with the high-voltage load 2, and a cathode terminal connected with the plus electrode side of the high-voltage battery HV. Drain terminals of the third FET 11C and the fourth FET 11D are connected in series, a source terminal of the third FET 11C is connected with the high-voltage battery HV, and a source terminal of the fourth FET 11D is connected with the high-voltage load 2.

One end of the resistor R is connected with the first connection point X between the drain terminals of the second FET 11B and the first FET 11A, and the other end of the resistor R is connected with the second connection point Y between the drain terminals of the fourth FET 11D and the third FET 11C. The first voltage detector 30 outputs a first detected voltage Vd obtained by detecting the voltage applied to the resistor R to the controller 50.

As described above, the semiconductor switch control device 1A according to the second embodiment includes the bidirectional shutoff circuit 70 installed between the high-voltage battery HV and the high-voltage load 2 and transmitting or shutting off a current flowing bidirectionally between the high-voltage battery HV and the high-voltage load 2, the resistor R to detect a voltage of the bidirectional shutoff circuit 70, the first voltage detector 30 detecting a voltage applied to the resistor R, and the controller 50 determining malfunction of the bidirectional shutoff circuit 70, based on a first detected voltage Vd detected by the first voltage detector 30. The bidirectional shutoff circuit 70 includes the second FET 11B and the first FET 11A including respective drain terminals connected in series, and the fourth FET 11D and the third FET 11C including respective drain terminals connected in series. One end of the resistor R is connected between the drain terminals of the second FET 11B and the first FET 11A, and the other end of the resistor R is connected between the drain terminals of the fourth FET 11D and the third FET 11C. With the structure, the semiconductor switch control device 1A produces the effects equal to those of the semiconductor switch control device 1 of the first embodiment, even with the structure in which the drain terminals are connected in series.

Third Embodiment

The following is explanation of a semiconductor switch control device 1B according to a third embodiment. The semiconductor switch control device 1B according to the third embodiment is different from the semiconductor switch control device 1 according to the first embodiment, in that the semiconductor switch control device 1B includes two batteries E1 and E2. Each of the batteries E1 and E2 is, for example, a 12 V battery for a vehicle. In the third embodiment, constituent elements equal to those of the first embodiment are denoted by the same reference numerals, and detailed explanation thereof is omitted. The semiconductor switch control device 1B has a structure in which the bidirectional shutoff circuit 10 is disposed between a plus electrode of the battery E1 and a plus electrode of the battery E2. The semiconductor switch control device 1B transmits or shuts off a current flowing from the battery E1 or the battery E2 to a load 4. As described above, the semiconductor switch control device 1B may be applied to the vehicle power system 100 including two batteries E1 and E2. An alternator (ALT) 5 charges the batteries E1 and E2.

A semiconductor switch control device according to each of the present embodiments includes a semiconductor switch module installed between a power supply and a load and transmitting or shutting off a current flowing bidirectionally between the power supply and the load, a resistor to detect a voltage of the semiconductor switch module, a first voltage detector to detect a voltage applied to the resistor, and a controller determining malfunction of the semiconductor switch module, based on a first detected voltage detected by the first voltage detector. The semiconductor switch module includes a first forward switch and a first reverse switch including respective source terminals connected in series, and a second forward switch and a second reverse switch including respective source terminals connected in series. The resistor includes one end connected between the source terminals of the first forward switch and the first reverse switch, and the other end connected between the source terminals of the second forward switch and the second reverse switch. With the structure, the semiconductor switch control device is capable of determining malfunction of the semiconductor switch module using one resistor, and suppresses an increase in the size of the device.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor switch control device comprising:
a semiconductor switch module installed between a power supply and a load, and that transmits or shuts off a current flowing bidirectionally between the power supply and the load;
a resistor that detects a voltage of the semiconductor switch module;
a first voltage detector that detects a voltage applied to the resistor; and
a controller configured to determine malfunction of the semiconductor switch module, based on a first detected voltage detected by the first voltage detector, wherein
the semiconductor switch module includes
a first semiconductor switch module, and
a second semiconductor switch module connected in parallel with the first semiconductor switch module,
the first semiconductor switch module includes
a first forward switch including a body diode disposed in a forward direction serving as a direction in which the current flows, and
a first reverse switch disposed adjacent to the first forward switch, and including a body diode disposed in a reverse direction reverse to the forward direction,
the first forward switch and the first reverse switch include respective source terminals connected in series, and respective drain terminals, one of the drain terminals being connected with the power supply, and the other of the drain terminals being connected with the load,
the second semiconductor switch module includes
a second forward switch including a body diode disposed in the forward direction, and
a second reverse switch disposed adjacent to the second forward switch, and including a body diode disposed in the reverse direction,
the second forward switch and the second reverse switch include respective source terminals connected in series, and respective drain terminals, one of the drain terminals being connected with the power supply, and the other of the drain terminals being connected with the load, and
the resistor includes one end connected between the source terminals of the first forward switch and the first reverse switch, and the other end connected between the source terminals of the second forward switch and the second reverse switch.

2. A semiconductor switch control device comprising:
a semiconductor switch module installed between a power supply and a load, and that transmits or shuts off a current flowing bidirectionally between the power supply and the load;
a resistor that detects a voltage of the semiconductor switch module;
a first voltage detector that detects a voltage applied to the resistor; and
a controller configured to determine malfunction of the semiconductor switch module, based on a first detected voltage detected by the first voltage detector, wherein
the semiconductor switch module includes
a first semiconductor switch module, and
a second semiconductor switch module connected in parallel with the first semiconductor switch module,
the first semiconductor switch module includes
a first forward switch including a body diode disposed in a forward direction serving as a direction in which the current flows, and
a first reverse switch disposed adjacent to the first forward switch, and including a body diode disposed in a reverse direction reverse to the forward direction,
the first forward switch and the first reverse switch include respective drain terminals connected in series, and respective source terminals, one of the source terminals being connected with the power supply, and the other of the source terminals being connected with the load, the second semiconductor switch module includes
a second forward switch including a body diode disposed in the forward direction, and
a second reverse switch disposed adjacent to the second forward switch, and including a body diode disposed in the reverse direction,
the second forward switch and the second reverse switch include respective drain terminals connected in series, and respective source terminals, one of the source terminals being connected with the power supply, and the other of the source terminals being connected with the load, and
the resistor includes one end connected between the drain terminals of the first forward switch and the first reverse switch, and the other end connected between the drain terminals of the second forward switch and the second reverse switch.

3. The semiconductor switch control device according to claim 1, wherein
the controller determines that any of the first forward switch, the first reverse switch, the second forward switch, and the second reverse switch incurs an OFF-state malfunction in which the determined switch is in an OFF state, based on a shift amount between the first detected voltage and a predetermined first reference voltage, when an instruction is issued to turn on all of the first forward switch, the first reverse switch, the second forward switch, and the second reverse switch.

4. The semiconductor switch control device according to claim 2, wherein
the controller determines that any of the first forward switch, the first reverse switch, the second forward switch, and the second reverse switch incurs an OFF-state malfunction in which the determined switch is in an OFF state, based on a shift amount between the first detected voltage and a predetermined first reference voltage, when an instruction is issued to turn on all of the first forward switch, the first reverse switch, the second forward switch, and the second reverse switch.

5. The semiconductor switch control device according to claim 3, wherein
the controller determines that one of the first forward switch and the second reverse switch incurs the OFF-state malfunction, when the shift amount between the first detected voltage and the first reference voltage is a positive voltage, and
the controller determines that one of the first reverse switch and the second forward switch incurs the OFF-state malfunction, when the shift amount between the first detected voltage and the first reference voltage is a negative voltage.

6. The semiconductor switch control device according to claim 4, wherein
the controller determines that one of the first forward switch and the second reverse switch incurs the OFF-state malfunction, when the shift amount between the first detected voltage and the first reference voltage is a positive voltage, and
the controller determines that one of the first reverse switch and the second forward switch incurs the OFF-state malfunction, when the shift amount between the first detected voltage and the first reference voltage is a negative voltage.

7. The semiconductor switch control device according to claim 1, further comprising:
a second voltage detector that detects a voltage applied to the load, wherein
the controller determines malfunction of the semiconductor switch module, based on a second detected voltage detected by the second voltage detector.

8. The semiconductor switch control device according to claim 2, further comprising:
a second voltage detector that detects a voltage applied to the load, wherein
the controller determines malfunction of the semiconductor switch module, based on a second detected voltage detected by the second voltage detector.

9. The semiconductor switch control device according to claim 3, further comprising:
a second voltage detector that detects a voltage applied to the load, wherein
the controller determines malfunction of the semiconductor switch module, based on a second detected voltage detected by the second voltage detector.

10. The semiconductor switch control device according to claim 4, further comprising:
a second voltage detector to detect a voltage applied to the load, wherein
the controller determines malfunction of the semiconductor switch module, based on a second detected voltage detected by the second voltage detector.

11. The semiconductor switch control device according to claim 5, further comprising:
a second voltage detector that detects a voltage applied to the load, wherein
the controller determines malfunction of the semiconductor switch module, based on a second detected voltage detected by the second voltage detector.

12. The semiconductor switch control device according to claim 6, further comprising:
a second voltage detector that detects a voltage applied to the load, wherein
the controller determines malfunction of the semiconductor switch module, based on a second detected voltage detected by the second voltage detector.

13. The semiconductor switch control device according to claim 7, wherein
the controller specifies which of the first forward switch, the first reverse switch, the second forward switch, and the second reverse switch incurs an OFF-state malfunction, based on the second detected voltage detected by the second voltage detector, and instruction values to turn on/off the first forward switch, the first reverse switch, the second forward switch, and the second reverse switch, in the OFF-state malfunction of the semiconductor switch module.

14. The semiconductor switch control device according to claim 8, wherein
the controller specifies which of the first forward switch, the first reverse switch, the second forward switch, and the second reverse switch incurs an OFF-state malfunction, based on the second detected voltage detected by the second voltage detector, and instruction values to turn on/off the first forward switch, the first reverse switch, the second forward switch, and the second reverse switch, in the OFF-state malfunction of the semiconductor switch module.

* * * * *